(12) United States Patent
Tsuda

(10) Patent No.: US 9,692,390 B2
(45) Date of Patent: Jun. 27, 2017

(54) FILTER DEVICE HAVING A WIRING ELECTRODE LOCATED IN A DIFFERENT ACOUSTIC PORTION

(71) Applicant: Murata Manufacturing Co., Ltd., Nagaokakyo-shi, Kyoto-fu (JP)

(72) Inventor: Motoji Tsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 14/444,039

(22) Filed: Jul. 28, 2014

(65) Prior Publication Data

US 2014/0333392 A1 Nov. 13, 2014

Related U.S. Application Data

(63) Continuation of application No. PCT/JP2013/050370, filed on Jan. 11, 2013.

(30) Foreign Application Priority Data

Feb. 6, 2012 (JP) .................................. 2012-023090

(51) Int. Cl.
*H03H 9/72* (2006.01)
*H03H 9/64* (2006.01)
(Continued)

(52) U.S. Cl.
CPC ...... *H03H 9/6489* (2013.01); *H03H 9/02992* (2013.01); *H03H 9/25* (2013.01); *H03H 9/725* (2013.01)

(58) Field of Classification Search
CPC ........... H03H 9/02559; H03H 9/02614; H03H 9/02653; H03H 9/02897; H03H 9/02905;
(Continued)

(56) References Cited

U.S. PATENT DOCUMENTS 6,879,086 B2 * 4/2005 Takamine ............ H03H 9/0038
310/313 D
7,046,102 B2 * 5/2006 Nakamura ........... H03H 9/0038
333/133
(Continued)

FOREIGN PATENT DOCUMENTS

JP 9-83030 A 3/1997
JP 2005-117151 A 4/2005
(Continued)

OTHER PUBLICATIONS

English language machine translation of JP 2011-160024, published on Aug. 18, 2011, 7 pages.*
(Continued)

*Primary Examiner* — Barbara Summons
(74) *Attorney, Agent, or Firm* — Keating & Bennett, LLP

(57) ABSTRACT

A filter device includes a piezoelectric substrate, an IDT arranged on a major surface of the piezoelectric substrate to define a surface acoustic wave resonator, a wiring electrode that is electrically connected to the IDT, and an acoustic member located on a major surface of the piezoelectric substrate near or adjacent to the IDT and that has an acoustic impedance different from that of the piezoelectric substrate. The wiring electrode that is to be disposed in the vicinity of the IDT is located on the acoustic member.

16 Claims, 15 Drawing Sheets

(51) Int. Cl.
*H03H 9/25* (2006.01)
*H03H 9/02* (2006.01)

(58) Field of Classification Search
CPC ........... H03H 9/02984; H03H 9/02929; H03H 9/02992; H03H 9/25; H03H 9/6489; H03H 9/725
USPC .......................................... 333/133, 193–196
See application file for complete search history.

(56) References Cited

U.S. PATENT DOCUMENTS

| | | | |
|---|---|---|---|
| 7,295,089 B2 * | 11/2007 | Shibahara | ............ H03H 9/0038 310/313 B |
| 7,889,025 B1 * | 2/2011 | Kosinski | .............. H03H 9/0211 310/313 B |
| 2005/0057324 A1 * | 3/2005 | Onishi | ..................... H03H 3/02 333/191 |
| 2005/0071971 A1 | 4/2005 | Yamato | |
| 2010/0148890 A1 | 6/2010 | Inoue et al. | |
| 2011/0102108 A1 | 5/2011 | Fukuda | |

FOREIGN PATENT DOCUMENTS

| | | | |
|---|---|---|---|
| JP | 2011-160024 A | * | 8/2011 |
| WO | 2009/057195 A1 | | 5/2009 |
| WO | 2009/150786 A1 | | 12/2009 |

OTHER PUBLICATIONS

Official Communication issued in corresponding International Application PCT/JP2013/050370, mailed on Mar. 12, 2013.

* cited by examiner

FIG. 4

| MATERIAL | ACOUSTIC VELOCITY OF TRANSVERSAL WAVE m/s | DENSITY g/cm$^3$ | ACOUSTIC IMPEDANCE ×10$^7$kg/m$^2$s |
|---|---|---|---|
| LT | 4200 | 7.46 | 3.13 |
| LN | 3600 | 4.64 | 1.67 |
|  |  |  |  |
| Au | 1245 | 19.30 | 2.40 |
| Ag | 1770 | 10.50 | 1.86 |
| Cu | 2399 | 8.93 | 2.14 |
| Pt | 1690 | 21.37 | 3.61 |
| Ni | 3240 | 8.85 | 2.87 |
| Ti | 3106 | 4.54 | 1.41 |
| Al | 3110 | 2.70 | 0.84 |
| Ta | 2220 | 16.60 | 3.69 |
|  |  |  |  |
| SiO$_2$ | 3760 | 2.70 | 1.02 |
| Si$_3$N$_4$ | 5950 | 3.20 | 1.90 |
| Ta$_2$O$_5$ | 2430 | 8.47 | 2.06 |
|  |  |  |  |
| POLYIMIDE | 1060 | 1.40 | 0.15 |
| POLYSTYRENE | 1150 | 1.05 | 0.12 |
| POLYETHYLENE | 120 | 0.92 | 0.01 |

FIG. 5

| INSULATING FILM (Zc) | Zc/Za (LT SUBSTRATE) | ENERGY RATIO E (LT SUBSTRATE) | Zc/Za (LN SUBSTRATE) | ENERGY RATIO E (LN SUBSTRATE) |
|---|---|---|---|---|
| Au | 0.767 | 0.98 | 1.437 | 0.97 |
| Ag | 0.594 | 0.93 | 1.114 | 1.00 |
| Cu | 0.684 | 0.96 | 1.281 | 0.98 |
| Pt | 1.153 | 0.99 | 2.162 | 0.86 |
| Ni | 0.917 | 1.00 | 1.719 | 0.93 |
| Ti | 0.450 | 0.86 | 0.844 | 0.99 |
| Al | 0.268 | 0.67 | 0.503 | 0.89 |
| Ta | 1.179 | 0.99 | 2.210 | 0.86 |
| $SiO_2$ | 0.326 | 0.74 | 0.611 | 0.94 |
| $Si_3N_4$ | 0.607 | 0.94 | 1.138 | 1.00 |
| $Ta_2O_5$ | 0.658 | 0.96 | 1.234 | 0.99 |
| POLYIMIDE | 0.048 | 0.17 | 0.090 | 0.30 |
| POLYSTYRENE | 0.038 | 0.14 | 0.072 | 0.25 |
| POLYETHYLENE | 0.003 | 0.01 | 0.006 | 0.03 |

FILTER DEVICE HAVING A WIRING ELECTRODE LOCATED IN A DIFFERENT ACOUSTIC PORTION

BACKGROUND OF THE INVENTION

1. Field of the Invention

The present invention relates to filter devices, and more particularly to a filter device in which interdigital transducers (IDTs) are arranged on a major surface of a piezoelectric substrate to define surface acoustic wave resonators.

2. Description of the Related Art

In the related art, surface acoustic wave devices, which are filter devices, have been used as a radio frequency (RF) filter, an intermediate frequency (IF) filter, and a resonator for a voltage controlled oscillator (VCO) for cellular phones, a video intermediate frequency (VIF) filter for a television, and the like. Japanese Unexamined Patent Application Publication No. 2005-117151 discloses a configuration of such a surface acoustic wave device.

Japanese Unexamined Patent Application Publication No. 2005-117151 discloses a surface acoustic wave device that includes interdigital transducers (IDTs) that are formed on a major surface of a piezoelectric substrate, reflectors that are disposed on the opposite sides of each of the IDTs in a propagation direction of surface acoustic waves that propagate from the IDTs, and wiring electrodes each of which is electrically connected to a corresponding one of the IDTs and each of which is disposed at least in the propagation direction of the surface acoustic waves.

However, in a surface acoustic wave device of the related art including the surface acoustic wave device, which is disclosed in Japanese Unexamined Patent Application Publication No. 2005-117151, a surface acoustic wave that propagates across a major surface of a piezoelectric substrate transmits vibrational energy to wiring electrodes depending on power applied to IDTs, the structure of the surface acoustic wave device, or the like, and as a result, breaking of the wiring electrodes and a short circuit between the wiring electrodes may occur. More specifically, in a surface acoustic wave device of the related art, there has been a problem in that when vibrational energy is transmitted to wiring electrodes, electrochemical migration occurs between the wiring electrodes or whiskers are generated between the wiring electrodes, and as a result, breaking of the wiring electrodes or a short circuit between a wiring electrode and another wiring electrode occurs.

For example, in a surface acoustic wave device in which an LT (LiTaO$_3$) substrate is used as a piezoelectric substrate, a leaky wave is used as a surface acoustic wave that propagates across a major surface of the piezoelectric substrate. In the case where this leaky wave propagates to reflectors that are disposed on the opposite sides of IDTs, upon application of power, wiring electrodes that are positioned outside of the reflectors generate heat as a result of vibrational energy generated by the leaky wave being applied thereto, the leaky wave propagates by passing through the reflectors, and breaking of the wiring electrodes or a short circuit between the wiring electrodes may occur. In particular, in the case where the wiring electrodes are formed of a metal film of Au, Al, or the like, breaking of the wiring electrodes or a short circuit may occur due to the vibrational energy generated by the leaky wave, which propagates across the piezoelectric substrate.

SUMMARY OF THE INVENTION

In view of such problems described above, preferred embodiments of the present invention provide a filter device that prevents breaking of wiring electrodes or a short circuit between wiring electrodes due to a surface acoustic wave that propagates across a major surface of a piezoelectric substrate.

A filter device according to an aspect of various preferred embodiments of the present invention includes a piezoelectric substrate, an IDT arranged on a major surface of the piezoelectric substrate to define a surface acoustic wave resonator, a wiring electrode that is electrically connected to the IDT, and a different acoustic portion that is located near or adjacent to the IDT and that has an acoustic impedance different from an acoustic impedance of the piezoelectric substrate, and the wiring electrode that is to be disposed near or adjacent to the IDT is located in the different acoustic portion.

In one preferred embodiment of the present invention, in the major surface of the piezoelectric substrate, the different acoustic portion is a portion in which an acoustic member that has an acoustic impedance different from the acoustic impedance of the piezoelectric substrate is provided.

In one preferred embodiment of the present invention, the different acoustic portion is a portion in which a step that is provided in the major surface of the piezoelectric substrate and a surface that is not in the same plane as the major surface is provided.

In one preferred embodiment of the present invention, the different acoustic portion includes the portion in which the acoustic member, which has the acoustic impedance different from the acoustic impedance of the piezoelectric substrate, is provided and the portion in which the step, which is provided in of the major surface of the piezoelectric substrate and the surface that is not in the same plane as the major surface, is provided.

In one preferred embodiment of the present invention, an acoustic impedance Zc to a surface acoustic wave on the major surface of the piezoelectric substrate and an acoustic impedance Za of the acoustic member to an acoustic velocity of a transversal wave have a relationship of Za/Zc<about 0.17, for example.

In one preferred embodiment of the present invention, the different acoustic portion is disposed in the portion in which the step is located, and the different acoustic portion includes an acoustic member that has an acoustic impedance different from the acoustic impedance of the piezoelectric substrate.

In one preferred embodiment of the present invention, the different acoustic portion includes the step that is defined by a groove that is located in the major surface of the piezoelectric substrate.

In one preferred embodiment of the present invention, the different acoustic portion includes the step that is arranged in such a manner that the major surface of the piezoelectric substrate on which the IDT is to be provided becomes a protruding portion.

In one preferred embodiment of the present invention, the different acoustic portion is provided at a position adjacent to a reflector that is located near or adjacent to the IDT.

According to various preferred embodiments of the present invention, a wiring electrode that is to be disposed in a vicinity of an IDT is located in a different acoustic portion that has an acoustic impedance different from that of a piezoelectric substrate. Therefore, a surface acoustic wave that propagates from the IDT is reduced in the different acoustic portion, and as a result, breaking of the wiring electrode or a short circuit is prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a table showing acoustic velocity of a transversal wave, density, and acoustic impedance with respect to materials.

FIG. 5 is a table showing the ratios of an LN substrate and a piezoelectric substrate to materials of an acoustic member and corresponding energy ratios E.

DETAILED DESCRIPTION OF THE PREFERRED EMBODIMENTS

Figure 1:
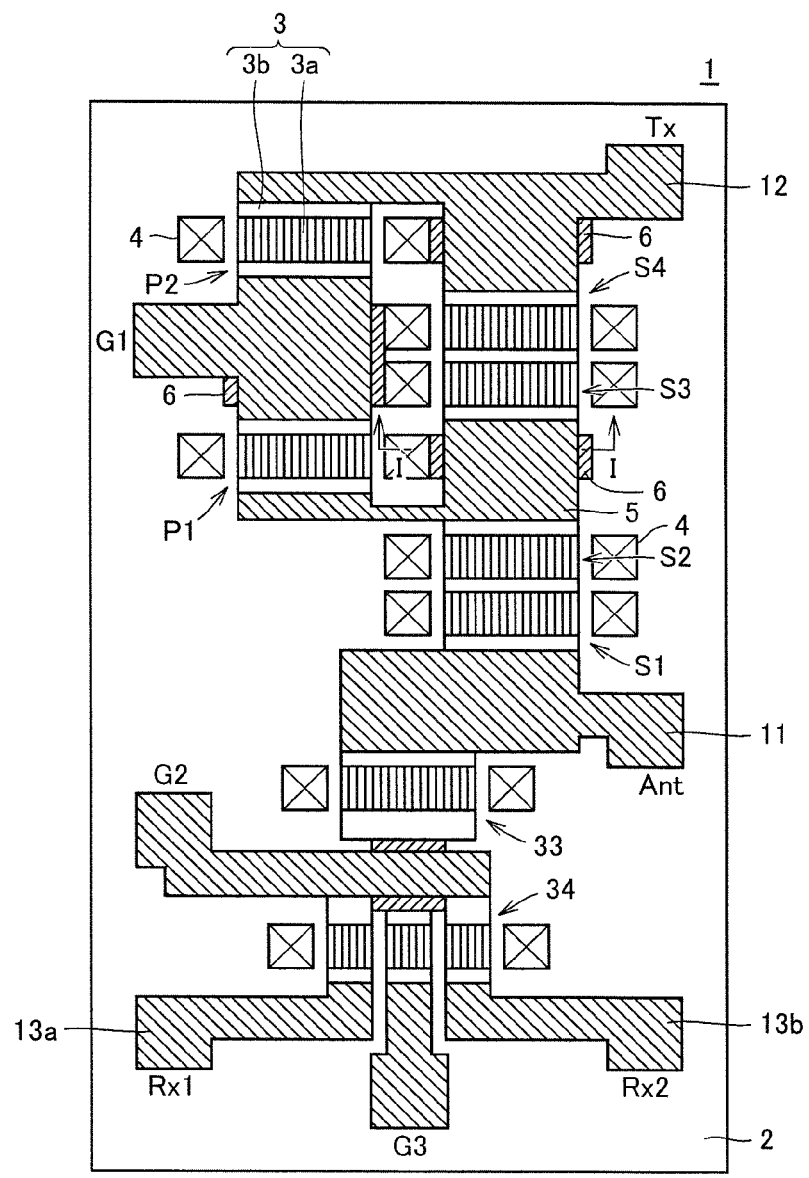
FIG. 1 is a plan view illustrating a configuration of a duplexer according to a first preferred embodiment of the present invention.

Preferred embodiments of the present invention will be described below taking a duplexer that is a surface acoustic wave filter device (hereinafter simply referred to also as a filter device) illustrated in FIG. 1 to FIG. 21 as an example. However, the duplexer is merely an example. The filter device according to the present invention is no way limited to a duplexer. The present invention can also be applied to, for example, filter devices other than duplexers such as transmission filters, reception filters, diplexers, triplexers, and multiplexers.

Note that, in the preferred embodiments of the present invention, which will be described below, portions that are the same as each other or portions that correspond to each other are denoted by the same reference numerals, and description of the portions may not be repeated. In addition, when numbers, amounts and the like are described, the scope of the present invention is not necessarily limited to the numbers, the amounts, and the like unless otherwise stated. Furthermore, each of the components described in the following preferred embodiments are not always essential for the present invention unless otherwise stated.

The duplexer according to the preferred embodiments preferably is to be mounted in a high-frequency device such as a cellular phone that uses a code division multiple access (CDMA) system, such as an universal mobile telecommunications system (UMTS), for example. The duplexer is a duplexer that uses UMTS-BAND5, for example. The transmission frequency band of UMTS-BAND5 is in the range of 824 MHz to 849 MHz, and the reception frequency band of UMTS-BAND5 is in the range of 869 MHz to 894 MHz.

First Preferred Embodiment

Figure 2:
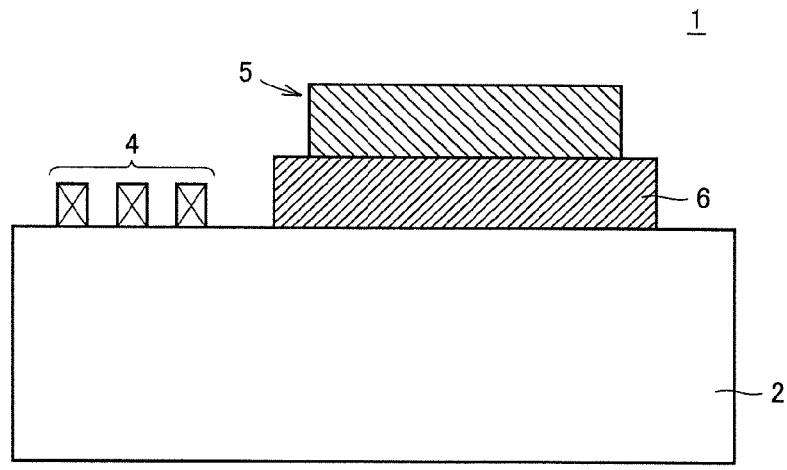
FIG. 2 is a sectional view taken along the plane I-I of the duplexer illustrated in FIG. 1.
Figure 3:
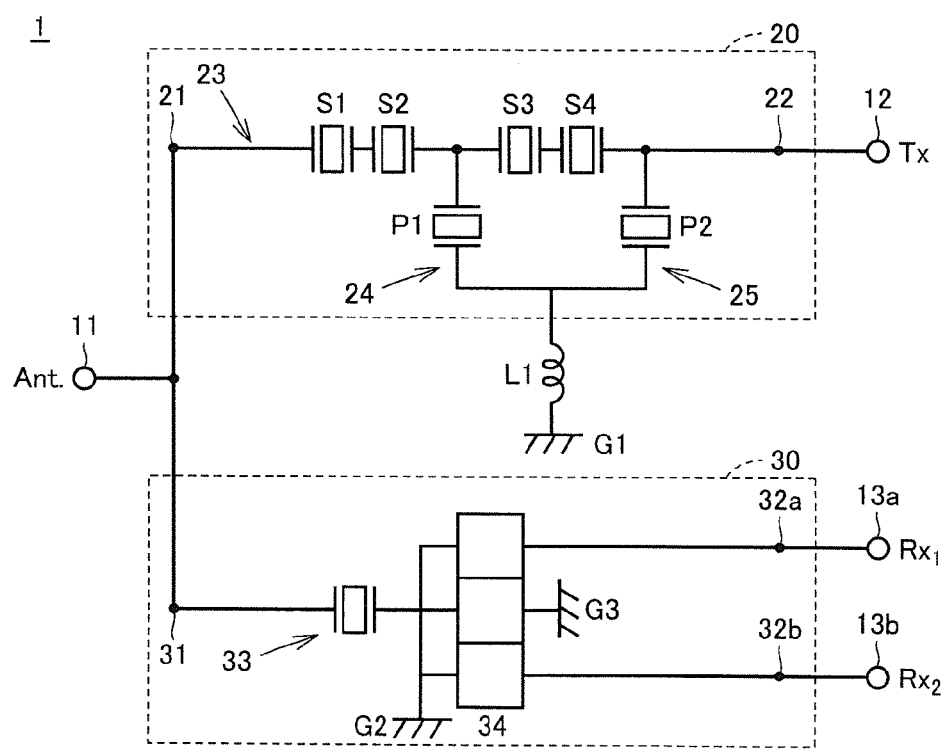
FIG. 3 is a schematic circuit diagram illustrating a circuit configuration of the duplexer according to a preferred embodiment of the present invention.

FIG. 1 is a plan view illustrating a configuration of a duplexer 1 according to a first preferred embodiment of the present invention. FIG. 2 is a sectional view taken along the plane I-I of the duplexer 1 illustrated in FIG. 1. FIG. 3 is a schematic circuit diagram illustrating a circuit configuration of the duplexer 1 according to the first preferred embodiment of the present invention.

First, as illustrated in FIG. 3, the duplexer 1 includes an antenna terminal 11 that is to be connected to an antenna, a transmission terminal (Tx) 12, and reception terminals (Rx1, Rx2) 13a and 13b. As illustrated in FIG. 3, a transmission filter 20 is connected between the antenna terminal 11 and the transmission terminal 12. In addition, a reception filter 30 is connected between the antenna terminal 11 and the reception terminals 13a and 13b.

As illustrated in FIG. 3, the transmission filter 20 includes a ladder surface acoustic wave filter. The transmission filter 20 includes an output terminal 21 and an input terminal 22. The output terminal 21 is connected to the antenna terminal 11, and the input terminal 22 is connected to the transmission terminal 12.

The transmission filter 20 includes a series arm 23 that connects the output terminal 21 and the input terminal 22. In the series arm 23, series arm resonators S1 to S4 are connected in series. The transmission filter 20 includes parallel arms 24 and 25 that are connected between the series arm and a ground G1. Parallel arm resonators P1 and P2 are disposed in the parallel arms 24 and 25, respectively. The series arm resonators S1 to S4 and the parallel arm resonators P1 and P2 are each defined by a surface acoustic wave resonator.

In addition, an inductor L1 is connected between the parallel arm resonators P1 and P2 and a ground G1.

As illustrated in FIG. 3, the reception filter 30 includes a longitudinally coupled resonator-type surface acoustic wave filter. The reception filter 30 is an unbalanced input-balanced output type filter. In other words, the reception filter 30 includes a balanced longitudinally coupled resonator-type surface acoustic wave filter that has a balanced-unbalanced transforming function. Therefore, the reception filter 30 includes an unbalanced input terminal 31 and first and second balanced output terminals 32a and 32b. The unbalanced input terminal 31 is connected to the antenna terminal 11, and the first and second balanced output terminals 32a and 32b are connected to the reception terminals 13a and 13b, respectively. The reception filter 30 includes a surface acoustic wave resonator 33 and a longitudinally coupled resonator-type surface acoustic wave filter 34 that are connected between the unbalanced input terminal 31 and the first and second balanced output terminals 32a and 32b.

A plane configuration of the duplexer 1 that defines the circuit configuration illustrated in FIG. 3 will now be described with reference to FIG. 1. As illustrated in FIG. 1, in the duplexer 1, IDTs 3 that define surface acoustic wave resonators (including the series arm resonators S1 to S4, the parallel arm resonators P1 and P2, the surface acoustic wave resonator 33, and the longitudinally coupled resonator-type surface acoustic wave filter 34) are provided on a piezoelectric substrate 2. Each of the IDTs 3 includes a multilayer film of Ti/AlCu that is deposited on the piezoelectric substrate 2 and comb-shaped electrodes that use a leaky wave as a main response wave.

More specifically, each of the IDTs 3 includes a pair of comb-shaped electrodes, and in each of the comb-shaped electrodes, a plurality of electrode fingers 3a that cause the piezoelectric substrate 2 to be excited at a predetermined frequency are commonly connected to one another by a busbar portion 3b. The electrode fingers 3a of the comb-shaped electrodes are arranged in such a manner that the electrode fingers 3a of one of the comb-shaped electrodes interdigitate with those of the other one of the comb-shaped electrodes in a non-contact manner.

Note that the duplexer 1 is not limited to the piezoelectric substrate 2 and the IDTs 3 made of AlCu. For example, an LN (LiNbO$_3$) substrate, a crystal substrate, an LBO (Li$_2$B$_4$O$_7$) substrate, or the like may be used as a substrate as long as it is a piezoelectric substrate that has piezoelectricity. Similarly, the IDTs 3 may include a single layer film or a multilayer film including metals such as Al, Ti, Pt, Cr, W, Cu, Au, Ni, Co, and Ta or alloys. In addition, each of the IDTs 3 is not limited to use a leaky wave as a main response wave, and a surface acoustic wave such as a Rayleigh wave or a Love wave may be used.

In addition, in the duplexer 1, reflectors 4 are disposed on the opposite sides of each of the IDTs 3 in a propagation direction of surface acoustic waves (e.g., leaky waves) that propagate from the IDTs 3. Note that each of the reflectors 4 is preferably made of Al, Pt, Cu, Au, Ti, NiCr, or the like and includes, for example, a metal film that includes Al and Ti.

In the duplexer 1, wiring electrodes 5 each of which has a predetermined pattern are arranged between the busbar portions 3b of the IDTs 3 in order to be electrically connected to the IDTs 3, which are located on the piezoelectric substrate 2. Note that each of the wiring electrodes 5 preferably is made of Al, Pt, Cu, Au, Ti, NiCr, or the like and includes, for example, a metal film that includes Al and Ti.

Portions of the wiring electrodes 5 except for portions of the wiring electrode 5 that are superposed with the busbar portions 3b of the corresponding IDTs 3 are provided on the piezoelectric substrate 2. However, in the duplexer 1, surface acoustic waves may propagate from the electrode fingers 3a of the IDTs 3 in a direction toward the corresponding reflectors 4 or in a direction toward the corresponding busbar portions 3b. When the propagating surface acoustic waves reach the wiring electrodes 5, vibrational energy is transmitted to the wiring electrodes 5. Therefore, electrochemical migration occurs between the wiring electrodes 5 or whiskers are generated between the wiring electrodes 5, and as a result, breaking of the wiring electrodes 5 and short circuits between the wiring electrodes 5 and other wiring electrodes may occur. In particular, in the case where each of the wiring electrodes 5 includes a metal film of Au, Al, or the like, the wiring electrodes 5 are likely to break or a short circuit between the wiring electrodes 5 is likely to occur due to the vibrational energy generated by a leaky wave that propagates to the piezoelectric substrate 2.

Therefore, in the duplexer 1 according to the first preferred embodiment, acoustic members 6 each of which has an acoustic impedance different from that of the piezoelectric substrate 2 are provided in order to reduce vibrational energy of surface acoustic waves that propagate to the vicinity of the IDTs 3. As illustrated in FIG. 2, in the duplexer 1, the acoustic members 6 are provided as films at positions adjacent to the corresponding reflectors 4, which are disposed in the vicinity of the corresponding IDT 3, and the wiring electrodes 5 are provided on the corresponding acoustic members 6. Thus, surface acoustic waves that propagate by passing through the reflectors 4 do not directly propagate to the wiring electrodes 5 and propagate to the wiring electrodes 5 after being reduced by the acoustic members 6. Therefore, breaking of the wiring electrodes 5 due to occurrence of electrochemical migration between the wiring electrodes 5 or short circuits between the wiring electrodes 5 and other wiring electrodes due to generation of whiskers are reliably prevented.

Each of the acoustic members 6 has an acoustic impedance different from the acoustic impedance (e.g., about $3.13 \times 10^7$ kg/m$^2$ s) of the piezoelectric substrate 2 and is a material that causes the acoustic impedance to be mismatched with the piezoelectric substrate 2, which is a piezoelectric substrate. FIG. 4 is a table showing acoustic velocity of a transversal wave, density, and acoustic impedance with respect to materials. Note that the units of acoustic velocity of a transversal wave are m/s, the units of density are g/cm$^3$, and the units of acoustic impedance are $\times 10^7$ kg/m$^2$s.

As illustrated in FIG. 4, the acoustic impedances of a polyimide, a polystyrene, and a polyethylene are in the range of about $0.01 \times 10^7$ kg/m$^2$s to about $0.15 \times 10^7$ kg/m$^2$s and are smaller than the acoustic impedance of the piezoelectric substrate 2. Therefore, the difference in acoustic impedance between each of the acoustic members 6 and the piezoelectric substrate 2 becomes large by using a polyimide, a polystyrene, or a polyethylene to form the acoustic members 6, and surface acoustic waves that propagate to the piezoelectric substrate 2 are reduced by the acoustic members 6.

The acoustic impedances of SiO$_2$, Si$_3$N$_4$, and Ta$_2$O$_5$ are in the range of about $1.02 \times 10^7$ kg/m$^2$s to about 2.06 kg/m$^2$s and are larger than the acoustic impedances of a polyimide, a polystyrene, and a polyethylene. However, there is a difference between each of these acoustic impedances and the acoustic impedance of the piezoelectric substrate 2. Therefore, the surface acoustic waves, which propagate to the piezoelectric substrate 2, are reduced by the acoustic members 6 also in the case where SiO$_2$, Si$_3$N$_4$, or Ta$_2$O$_5$ is used to define the acoustic members 6, although the reducing effect becomes smaller than that in the case where a polyimide, a polystyrene, or a polyethylene is used to form the acoustic members 6.

As described above, as the difference in acoustic impedance between each of the acoustic members 6 and the piezoelectric substrate 2 becomes larger, propagating surface acoustic waves are further reduced by the acoustic members 6. When the acoustic impedance to a surface acoustic wave on a major surface of the piezoelectric substrate 2 is Za, and the acoustic impedance of each of the acoustic members 6 to the acoustic velocity of a transversal wave is Zc, the energy ratio E of a transversal wave that is transmitted from the piezoelectric substrate 2 to each of the acoustic members 6 is expressed by the following formula (1).

$$E = \frac{4Za \cdot Zc}{(Za - Zc)^2} \quad \text{(Formula 1)}$$

When a relationship of Zc/Za<0.17 is satisfied, propagating surface acoustic waves are effectively reduced by the acoustic members 6, and an effect of preventing with certainty the breaking of the wiring electrodes 5 and a short circuit between the wiring electrodes 5 is obtained and was experimentally confirmed. It is assumed that the effect was obtained because the energy ratio E of the transversal wave that propagates from the piezoelectric substrate 2 to each of the acoustic members 6 is reduced to less than half when Zc/Za<about 0.17 or Zc/Za>about 5.8, and as a result, energy transfer of a surface acoustic wave from the piezoelectric substrate 2 to each of the acoustic members 6 is significantly reduced.

FIG. 5 is a table showing the ratios of an LN substrate and a piezoelectric substrate to materials of the acoustic members 6 and corresponding energy ratios E. As illustrated in FIG. 5, a configuration that satisfies Zc/Za>about 5.8 is not usually employed. In a configuration including the piezoelectric substrate 2 and the acoustic members 6 each of which has an acoustic impedance that satisfies Zc/Za<about 0.17, an acoustic impedance that is much larger than the acoustic impedance of each of the acoustic members 6 can be selected as the acoustic impedance of the piezoelectric substrate 2. In addition, it is preferable that a resin material such as a polyimide, a polystyrene, or a polyethylene be used for the acoustic members 6 each of which satisfies Zc/Za<about 0.1, for example. The acoustic members 6 that are to be provided on the piezoelectric substrate 2 can be formed relatively freely in terms of shape and thickness. In addition, the difference in acoustic impedance between each of the acoustic members 6 and the piezoelectric substrate 2 becomes large, and also the corresponding energy ratio E is reduced to less than one-third. As a result, the energy transfer of the surface acoustic wave from the piezoelectric substrate 2 to the acoustic members 6 is further reduced.

Note that members (acoustic members) that are provided to reduce the vibrational energy of the surface acoustic waves, which propagate to the vicinity of the IDTs 3, are not limited to the acoustic members 6 and may be a material that has an acoustic impedance different from that of the piezoelectric substrate 2.

Figure 6:
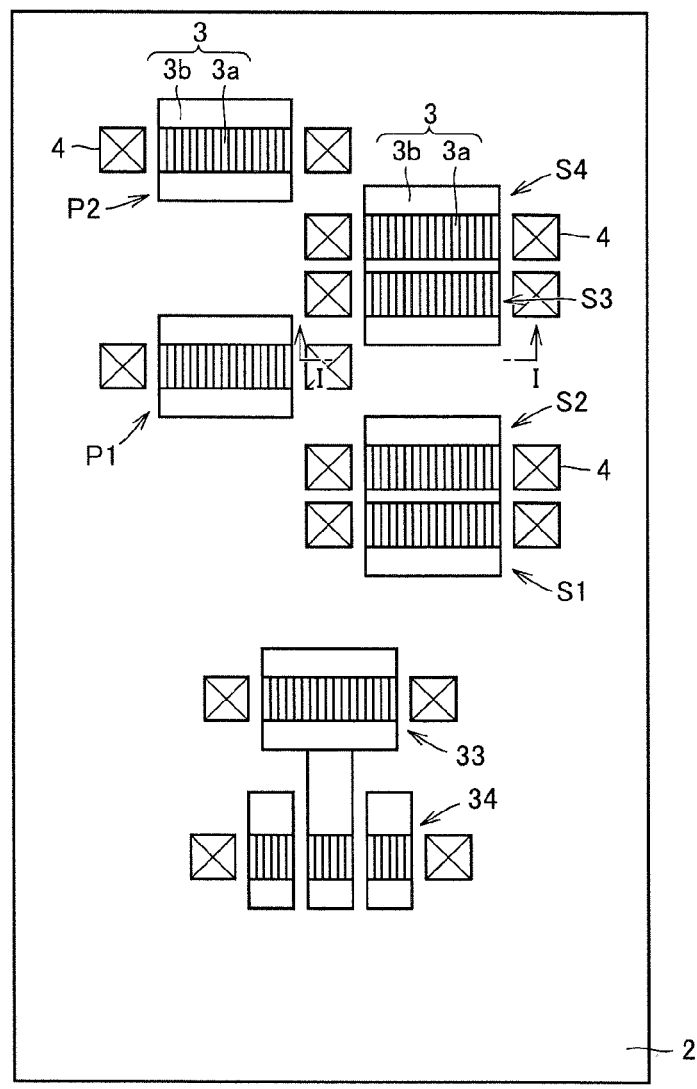
FIG. 6 is a plan view illustrating a configuration of a piezoelectric substrate on which IDTs and reflectors are provided.
Figure 7:
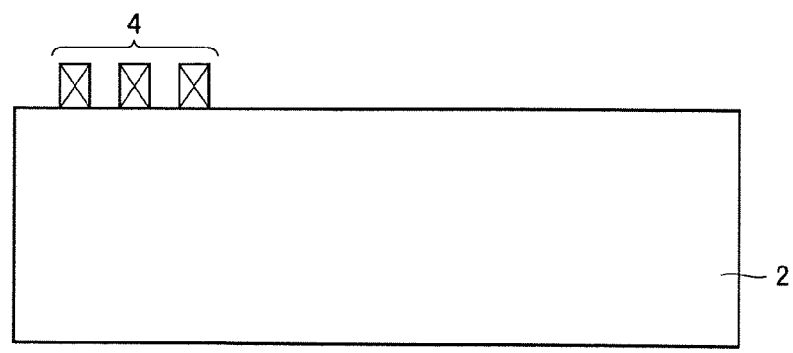
FIG. 7 is a sectional view taken along the plane I-I of the piezoelectric substrate illustrated in FIG. 6.

A non-limiting example of a method of manufacturing the duplexer 1 according to the first preferred embodiment of the present invention will now be described. First, FIG. 6 is a plan view illustrating a configuration of the piezoelectric substrate 2 on which the IDTs 3 and the reflectors 4 are formed. FIG. 7 is a sectional view taken along the plane I-I of the piezoelectric substrate 2 illustrated in FIG. 6. As illustrated in FIG. 6, a multilayer film of Ti/AlCu is deposited on the piezoelectric substrate 2, and the IDTs 3 and the reflectors 4 are formed at predetermined positions by using a photolithography technique. When the IDTs 3 and the reflectors 4 are formed on the piezoelectric substrate 2, nothing is formed at positions adjacent to the reflectors 4 as illustrated in FIG. 7.

Figure 8:
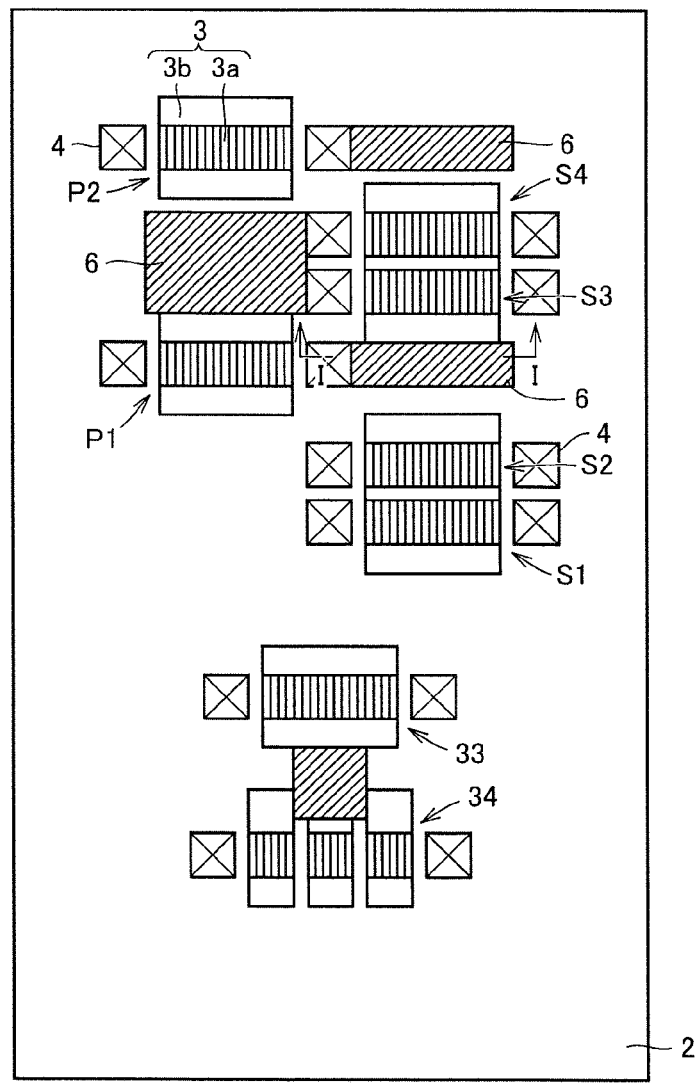
FIG. 8 is a plan view illustrating a configuration of a piezoelectric substrate on which acoustic members are provided.
Figure 9:
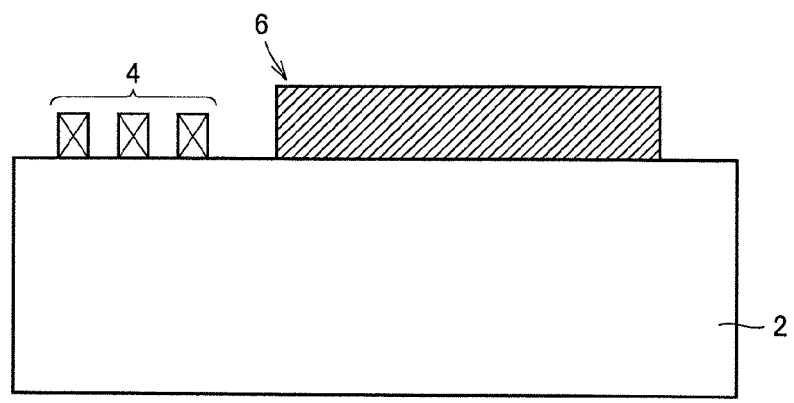
FIG. 9 is a sectional view taken along the plane I-I of the piezoelectric substrate illustrated in FIG. 8.

After that, the acoustic members 6 are formed at the positions adjacent to the reflectors 4. FIG. 8 is a plan view illustrating a configuration of the piezoelectric substrate 2 on which the acoustic members are formed. FIG. 9 is a sectional view taken along the plane I-I of the piezoelectric substrate 2 illustrated in FIG. 8. As illustrated in FIG. 8 and FIG. 9, insulating films are formed of polyimide films each having a film thickness of about 2 μm, for example, as the acoustic members 6 at the positions adjacent to the reflectors 4 on the piezoelectric substrate 2. In particular, the acoustic members 6 are formed at positions at which the wiring electrodes 5 are to be routed among the positions adjacent to the reflectors 4.

Each of the acoustic members 6 may be an insulating material other than a polyimide, and a material that has a large difference in acoustic impedance from the piezoelectric substrate 2 is further preferable. Therefore, it is desirable that each of the acoustic members 6 be an organic acoustic member such as a polyimide, a polystyrene, or a polyethylene rather than an inorganic acoustic member such as $SiO_2$ or $Si_3Ni_4$. The acoustic members 6 are formed not only at the positions adjacent to the reflectors 4 but also in portions in which other wiring electrodes three-dimensionally intersect with one another. More specifically, an organic insulating film such as a polyimide is formed as an acoustic member 6a at a position at which a wiring electrode, which connects the surface acoustic wave resonator 33 and the longitudinally coupled resonator-type surface acoustic wave filter 34, and a different wiring electrode that is disposed on a propagation path of a surface acoustic wave three-dimensionally intersect with each other.

In addition, the acoustic members 6 are formed at positions adjacent to the reflectors 4 only in the transmission filter 20 to which a large amount of power is to be applied. However, in the case where the duplexer 1 is a system such as a femtocell in which a large amount of power is to be applied to the reception filter 30, advantageous effects similar to the above may be obtained for the reception filter 30 by forming the acoustic members 6 at positions adjacent to the reflectors 4 in the reception filter 30.

After that, as illustrated in FIG. 1 and FIG. 2, the multilayer film of Ti/AlCu is deposited on the piezoelectric substrate 2 on which the acoustic members 6 have been formed, and the wiring electrodes 5 are formed at predetermined positions by using a photolithography technique. In addition, formation of an external terminal, which is not illustrated, connection of the duplexer 1 and a circuit board, and the like are suitably performed by using appropriate structures and appropriate methods using publicly known techniques. Note that the manufacturing method illustrated in FIG. 1, FIG. 2, and FIG. 6 to FIG. 9 is an example, and a method of manufacturing the duplexer 1 according to the first preferred embodiment of the present invention is not limited to the above-described manufacturing method.

As described above, in the duplexer 1 according to the first preferred embodiment of the present invention, the acoustic members 6 (different acoustic portions), each of which has an acoustic impedance different from that of the piezoelectric substrate 2, are located on the piezoelectric substrate 2 in the vicinity of the IDTs 3, and the wiring electrodes 5 that are to be positioned in the vicinity of the IDTs 3 are provided on the corresponding acoustic members 6. As a result, the duplexer 1 reduces surface acoustic waves, which propagate from the IDTs 3, by the acoustic members 6, and breaking of the wiring electrodes and a short circuit between the wiring electrodes 5 are prevented.

Second Preferred Embodiment

In the duplexer 1 according to the first preferred embodiment, the different acoustic portions each of which has an acoustic impedance different from that of the piezoelectric substrate 2 are provided preferably by forming the acoustic members 6 on the piezoelectric substrate 2 in the vicinity of the IDTs 3. However, the different acoustic portions, each of which has an acoustic impedance different from that of the piezoelectric substrate 2, are not limited to being defined by the acoustic members 6 and may be provided by forming steps that are provided in the major surface (the surface on which the IDTs 3 are located) of the piezoelectric substrate 2 and surfaces that are not in the same plane as the major surface.

In other words, in place of the acoustic members 6, air gaps each of which has an acoustic impedance different from that of the piezoelectric substrate 2 preferably are provided by forming steps in the major surface of the piezoelectric substrate 2. Therefore, portions (different acoustic portions) in which the acoustic impedance of each of the air gaps and the acoustic impedance of the piezoelectric substrate 2 are mismatched are provided. More specifically, steps are provided in the major surface of the piezoelectric substrate 2 preferably by forming grooves in the major surface of the piezoelectric substrate 2, for example.

A non-limiting example of a method of manufacturing the duplexer 1 according to a second preferred embodiment of the present invention will be described. Note that components that are the same as the components according to the first preferred embodiment are denoted by the same reference numerals, and detailed descriptions thereof will not be repeated.

Figure 10:
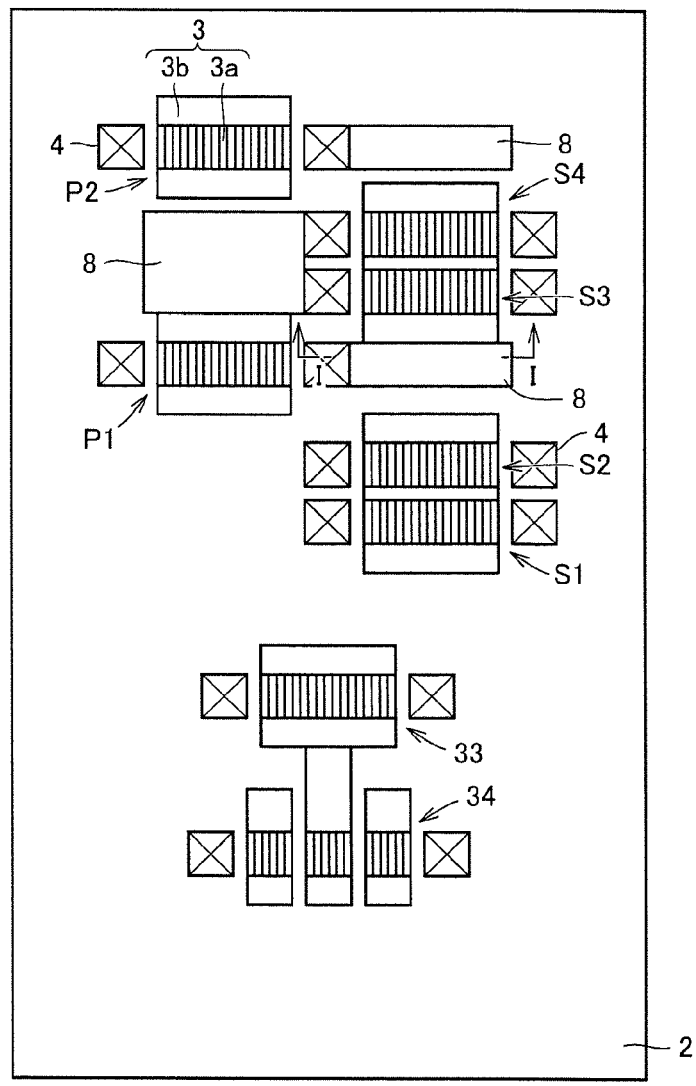
FIG. 10 is a plan view illustrating a configuration of a piezoelectric substrate in which grooves are provided.
Figure 11:
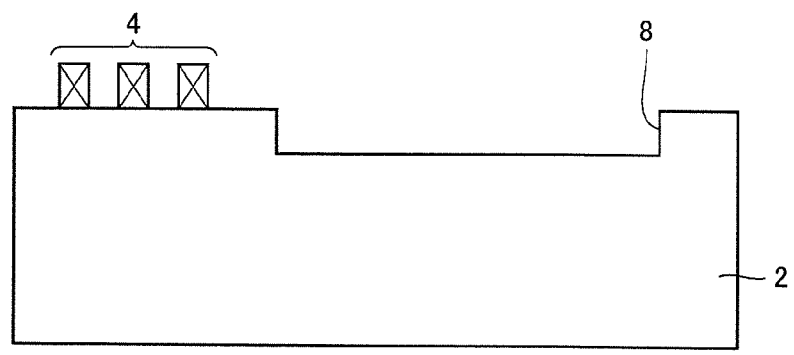
FIG. 11 is a sectional view taken along the plane I-I of the piezoelectric substrate illustrated in FIG. 10.

First, FIG. 10 is a plan view illustrating a configuration of the piezoelectric substrate 2 in which grooves are formed. FIG. 11 is a sectional view taken along the plane I-I of the piezoelectric substrate 2 illustrated in FIG. 10. As illustrated in FIG. 10, grooves 8 each of which preferably has a depth of about 0.5 μm, for example, are formed at positions adjacent to the reflectors 4 on the piezoelectric substrate 2, on which the IDTs 3 and the reflectors 4 have been formed, by using a dry etching technique using Ar. In particular, the grooves 8 are formed at positions that are adjacent to the reflectors 4 and at which the wiring electrodes 5 are to be routed on the piezoelectric substrate 2 among positions at which the reflectors 4 are not adjacent to the IDTs 3. As illustrated in FIG. 11, the grooves 8 are formed in the piezoelectric substrate 2 that is adjacent to outer side portions of the reflectors 4, which are disposed in the vicinity of the IDTs 3 in a propagation direction of a surface acoustic wave. As a result, the air gaps each of which has an acoustic impedance different from that of the piezoelectric substrate 2 are formed at the positions adjacent to the reflectors 4 and at which the wiring electrodes 5 are to be formed, on the piezoelectric substrate 2. Therefore, the portions (the different acoustic portions) in which the acoustic impedance of each of the air gaps and the acoustic impedance of the piezoelectric substrate 2 are mismatched are formed on a propagation path of a surface acoustic wave that includes the wiring electrodes 5.

Figure 12:
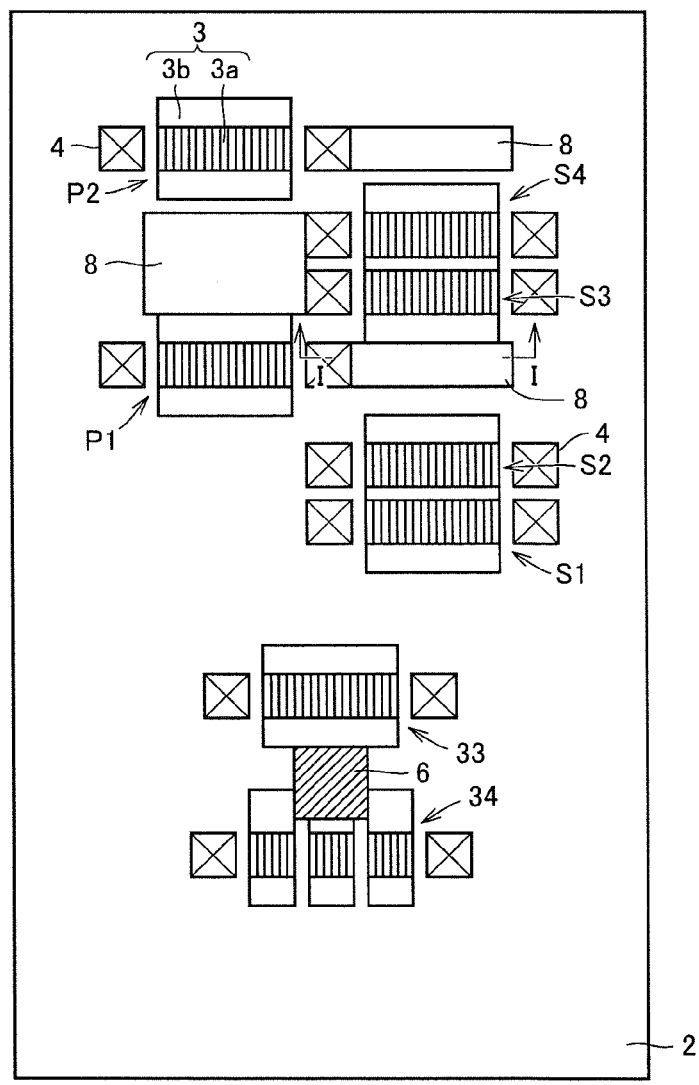
FIG. 12 is a plan view illustrating a configuration of a piezoelectric substrate on which an acoustic member is provided.

After that, the acoustic members 6 are formed in portions in which wiring electrodes three-dimensionally intersect with one another and the like. FIG. 12 is a plan view illustrating a configuration of the piezoelectric substrate 2 on which an acoustic member is formed. As illustrated in FIG. 12, a polyimide film preferably having a film thickness of about 2 μm is deposited on the piezoelectric substrate 2, and the polyimide film is formed on the piezoelectric substrate 2 as the acoustic member 6.

Figure 13:
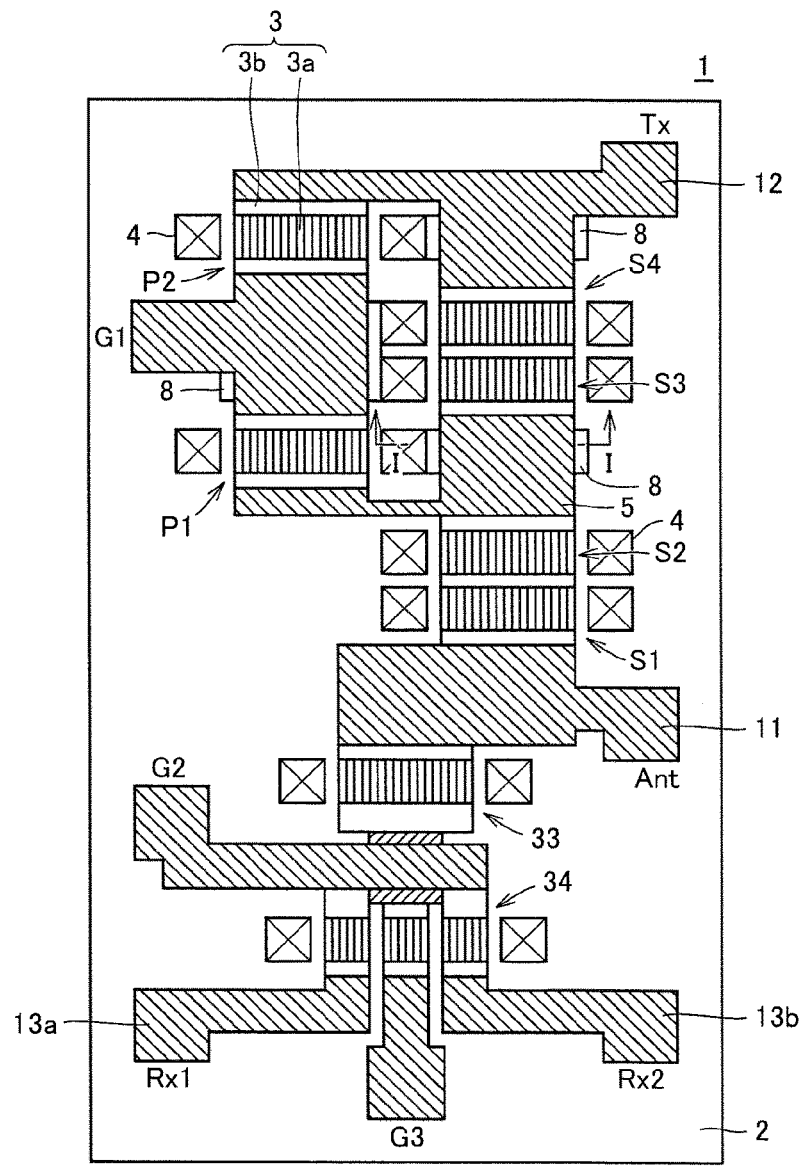
FIG. 13 is a plan view illustrating a configuration of a piezoelectric substrate on which wiring electrodes are provided.
Figure 14:
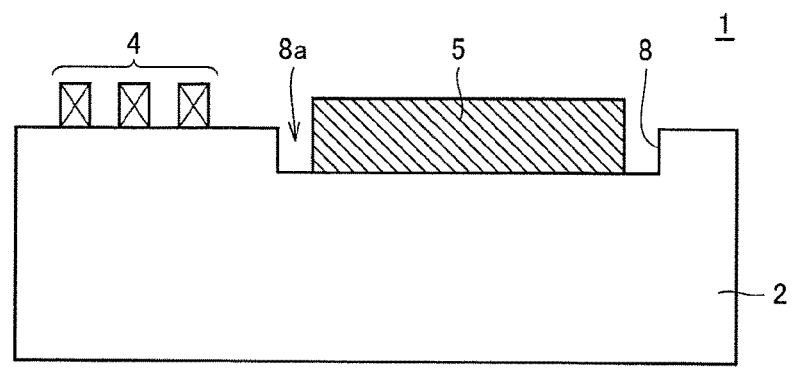
FIG. 14 is a sectional view taken along the plane I-I of the piezoelectric substrate illustrated in FIG. 13.

In addition, the wiring electrodes 5 are formed on the piezoelectric substrate 2 in which the grooves 8 have been formed. FIG. 13 is a plan view illustrating a configuration of the piezoelectric substrate 2 on which the wiring electrodes 5 are formed. FIG. 14 is a sectional view taken along the plane I-I of the piezoelectric substrate 2 illustrated in FIG. 13. As illustrated in FIG. 13, a multilayer film of Ti/AlCu is deposited on the piezoelectric substrate 2 in which the grooves 8 have been formed, and the wiring electrodes 5 are formed at predetermined positions by using a photolithography technique, for example. As illustrated in FIG. 14, the wiring electrodes 5 are formed also in the grooves 8 that have been formed at positions adjacent to the reflectors 4. Air gaps 8a that are formed by forming the grooves 8 are present between the piezoelectric substrate 2 and the wiring electrodes 5.

Therefore, in the duplexer 1, surface acoustic waves that propagate from the IDTs 3 are reduced as a result of the mismatching of the acoustic impedance of each of the air gaps 8a and the acoustic impedance of the piezoelectric substrate 2. This reduction includes a reduction due to reflection. Thus, breaking of the wiring electrodes 5 and a short circuit between the wiring electrodes 5 in the duplexer 1 are reliably prevented.

Note that the grooves 8 are located at positions adjacent to the reflectors 4 only in the transmission filter 20 to which a large amount of power is to be applied. However, in the case where the duplexer 1 is a system such as a femtocell in which a large amount of power is to be applied to the reception filter 30, advantageous effects similar to the above are obtained for the reception filter 30 by providing grooves at positions adjacent to the reflectors 4 in the reception filter 30.

After that, in addition, formation of an external terminal, which is not illustrated, connection of the duplexer 1 and a circuit board, and the like are suitably performed by using appropriate structures and appropriate methods. Note that the manufacturing method illustrated in FIG. 10 to FIG. 14 is an example, and a method of manufacturing the duplexer 1 according to the second preferred embodiment of the present invention is not limited to the above-described manufacturing method.

As described above, in the duplexer 1 according to the second preferred embodiment of the present invention, the grooves 8 are provided at the positions adjacent to the reflectors 4, and the wiring electrodes 5, which are to be positioned in the vicinity of the IDTs 3, are located in the grooves 8. As a result, the duplexer 1 reduces surface acoustic waves, which propagate from the IDTs 3, by the air gaps 8a, which are defined by the grooves 8, and breaking of the wiring electrodes 5 and a short circuit between the wiring electrodes 5 are reliably prevented. In addition, in the duplexer 1 according to the second preferred embodiment of the present invention, the height of a portion of each of the wiring electrodes 5, which are provided in the corresponding grooves 8, is reduced so as to be low.

Note that the duplexer 1 is not limited to the case where only the steps, which are defined by the grooves 8, are provided as the different acoustic portions, and both the portions in which the steps are provided and the portions in which the acoustic members 6 described in the first preferred embodiment are provided may define the different acoustic portions. In addition, the duplexer 1 further reduces the surface acoustic waves, which propagate from the IDTs 3, by providing the acoustic members 6 in the portions in which the grooves 8 are located and by providing wiring electrodes 5 on the acoustic members 6.

Third Preferred Embodiment

Although the case where the steps are provided in the major surface of the piezoelectric substrate 2 by forming the grooves 8 at the positions adjacent to the reflectors 4 in the duplexer 1 according to the second preferred embodiment has been described, the present invention is not limited to this. In the duplexer 1 according to a third preferred embodiment of the present invention, a step is arranged in such a manner that the major surface of the piezoelectric substrate 2 on which the IDTs are to be provided defines a protruding portion. More specifically, a step is provided in the major surface of the piezoelectric substrate 2 preferably by forming grooves around the position at which the IDTs 3 are to be provided in the piezoelectric substrate 2 on which the IDTs 3 have not yet been formed in such a manner that the major surface at the position at which the IDTs 3 are to be provided becomes a protruding portion.

A non-limiting example of a method of manufacturing the duplexer 1 according to the third preferred embodiment of the present invention will be described. Note that components that are the same as the components according to the first preferred embodiment are denoted by the same reference numerals, and detailed descriptions thereof will not be repeated.

Figure 15:
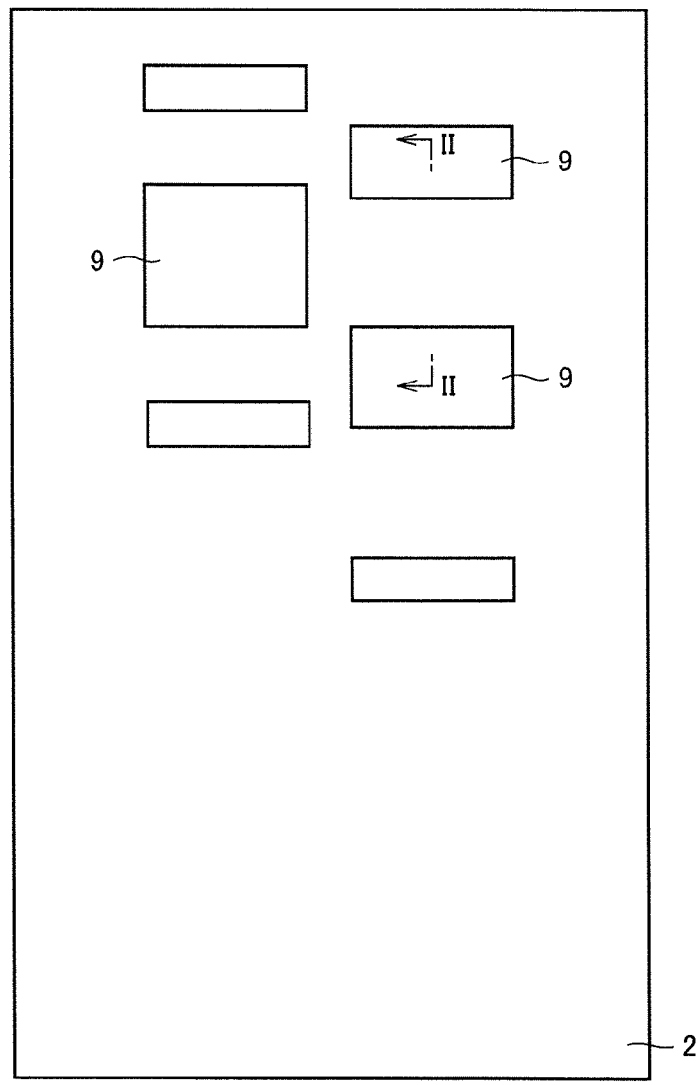
FIG. 15 is a plan view illustrating a configuration of a piezoelectric substrate in which grooves are provided.
Figure 16:
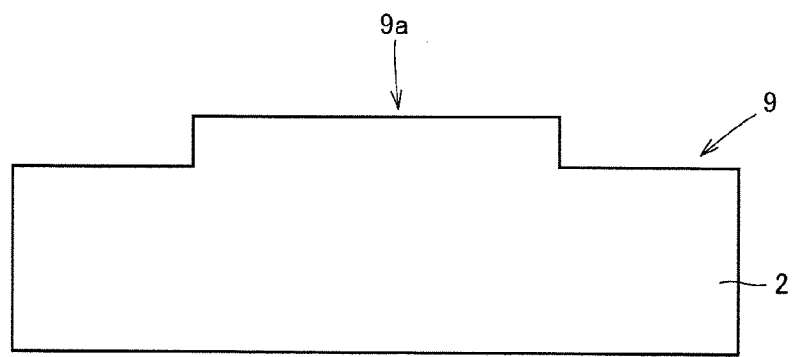
FIG. 16 is a sectional view taken along the plane II-II of the piezoelectric substrate illustrated in FIG. 15.

First, FIG. 15 is a plan view illustrating a configuration of the piezoelectric substrate 2 in which grooves are formed. FIG. 16 is a sectional view taken along the plane II-II of the piezoelectric substrate 2 illustrated in FIG. 15. As illustrated in FIG. 15, grooves 9 each of which preferably has a depth of about 0.5 μm are formed around positions at which the IDTs 3 are to be formed in the piezoelectric substrate 2 by using a dry etching technique using Ar. In particular, the grooves 9 are formed at positions at which the wiring electrodes 5 are to be routed in the vicinity of the positions at which the IDTs 3 are to be formed.

As illustrated in FIG. 16, the grooves 9 are formed such that a portion of the major surface at the position at which the IDTs 3 are to be formed can be formed so as to be a protruding portion 9a. Therefore, air gaps, each of which has a different acoustic impedance, can be formed in portions of the piezoelectric substrate 2 that are in the vicinity of the positions at which the IDTs 3 are to be formed. Portions (different acoustic portions) in which the acoustic impedance of the piezoelectric substrate 2 and the acoustic impedance of each of the air gaps are mismatched can be formed.

Figure 17:
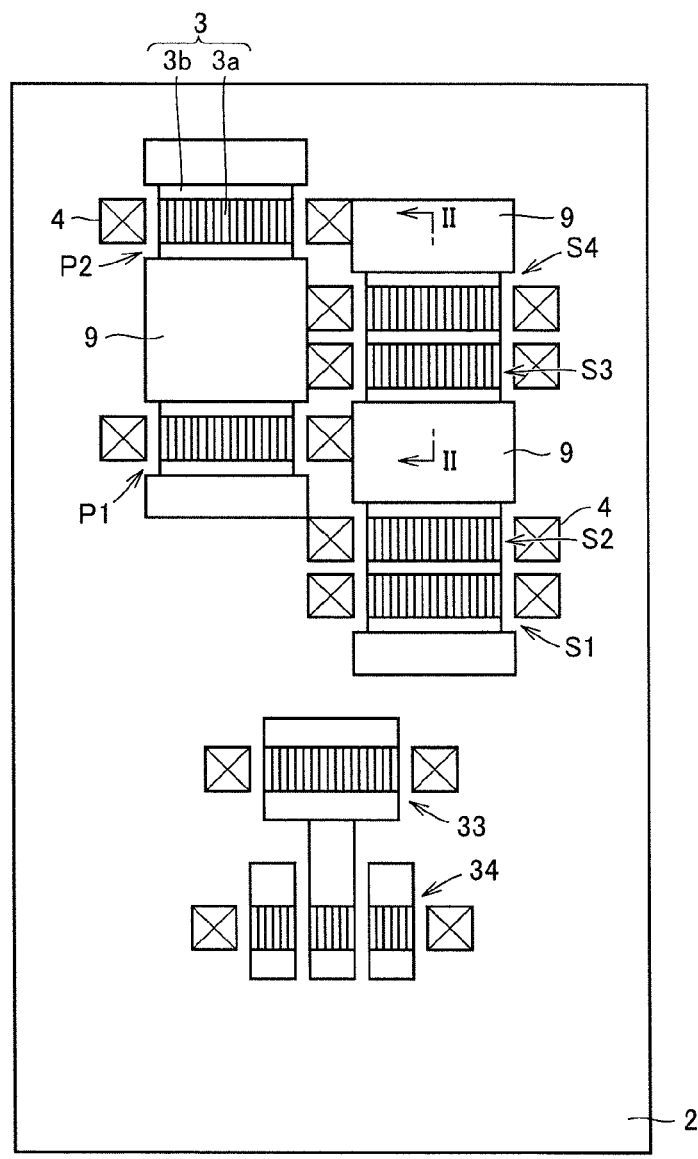
FIG. 17 is a plan view illustrating a configuration of a piezoelectric substrate on which IDTs and reflectors are provided.
Figure 18:
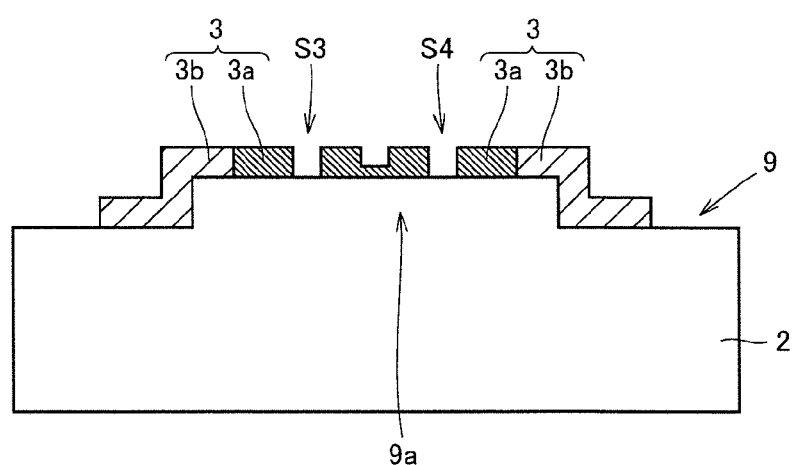
FIG. 18 is a sectional view taken along the plane II-II of the piezoelectric substrate illustrated in FIG. 17.

After that, the IDTs 3 and the reflectors 4 are formed on the piezoelectric substrate 2 in which the grooves 9 have been formed. FIG. 17 is a plan view illustrating a configuration of the piezoelectric substrate 2 on which the IDTs 3 and the reflectors 4 are formed. FIG. 18 is a sectional view taken along the plane II-II of the piezoelectric substrate 2 illustrated in FIG. 17. As illustrated in FIG. 17, a multilayer film of Ti/AlCu is deposited on the piezoelectric substrate 2, and the IDTs 3 and the reflectors 4 are formed at predetermined positions by using a photolithography technique. As illustrated in FIG. 18, the IDTs 3 are formed on the protruding portion 9a of the piezoelectric substrate 2.

Figure 19:
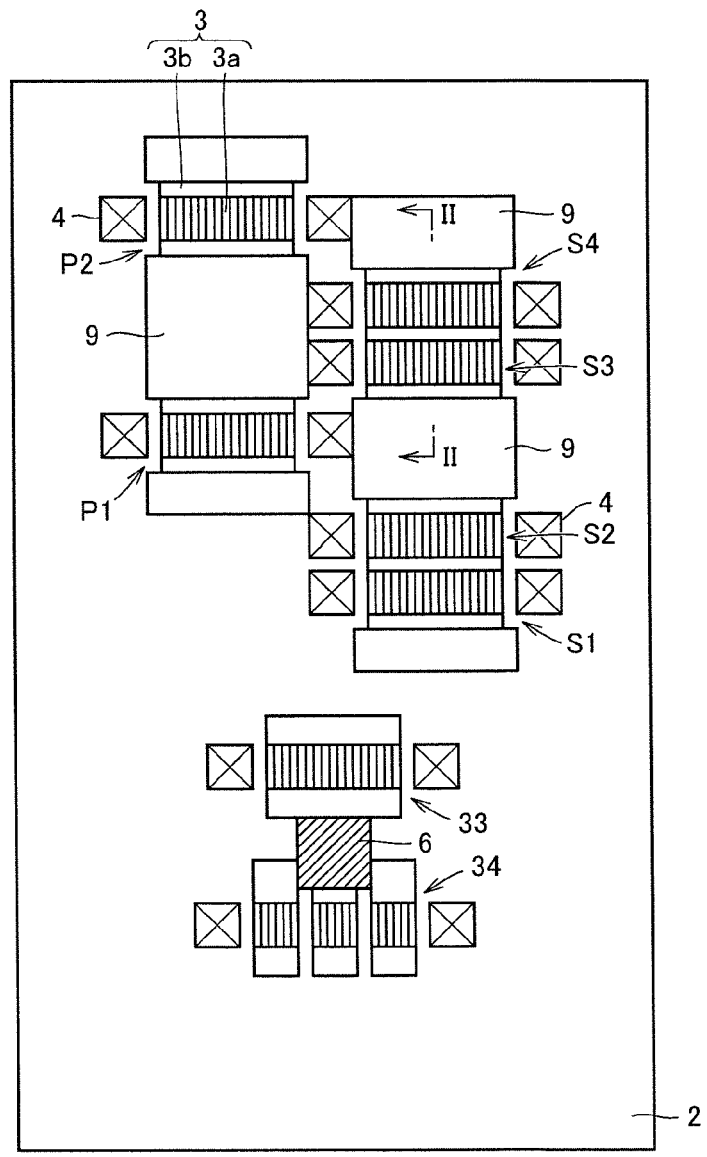
FIG. 19 is a plan view illustrating a configuration of a piezoelectric substrate on which an acoustic member is provided.

After that, the acoustic member 6 is formed in a portion in which wiring electrodes three-dimensionally intersect with each other and the like. FIG. 19 is a plan view illustrating a configuration of the piezoelectric substrate 2 on which an acoustic member is formed. As illustrated in FIG. 19, a polyimide film preferably having a film thickness of about 2 μm, for example, is deposited on the piezoelectric substrate 2, and the polyimide film is formed on the piezoelectric substrate 2 as the acoustic member 6.

Figure 20:
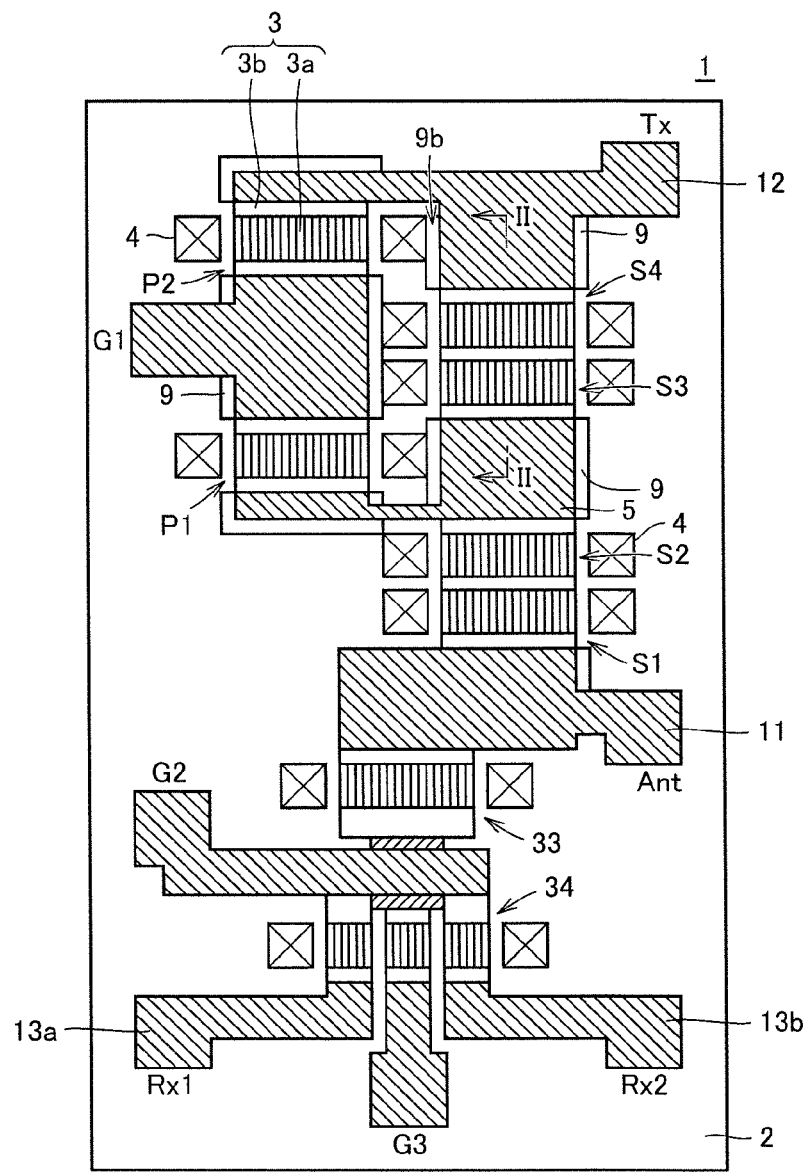
FIG. 20 is a plan view illustrating a configuration of a piezoelectric substrate on which wiring electrodes are provided.
Figure 21:
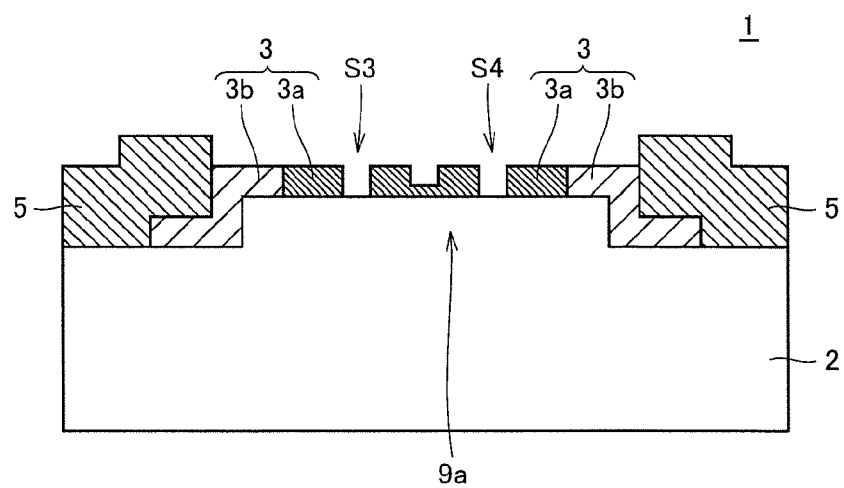
FIG. 21 is a sectional view taken along the plane II-II of the piezoelectric substrate illustrated in FIG. 20.

In addition, the wiring electrodes 5 are formed on the piezoelectric substrate 2 on which the IDTs 3 and the reflectors have been formed. FIG. 20 is a plan view illustrating a configuration of the piezoelectric substrate 2 on which the wiring electrodes 5 are formed. FIG. 21 is a sectional view taken along the plane II-II of the piezoelectric substrate 2 illustrated in FIG. 20. As illustrated in FIG. 20, a multilayer film of Ti/AlCu is deposited on the piezoelectric substrate 2 in which the grooves 9 have been formed, and the wiring electrodes 5 are formed at predetermined positions by using a photolithography technique. As illustrated in FIG. 21, the wiring electrodes 5 that are electrically connected to the corresponding IDTs 3, which are formed on the protruding portion 9a of the piezoelectric substrate 2, are formed in the grooves 9. The wiring electrodes 5 are formed in the grooves 9 so that air gaps 9b that are formed by forming the grooves 9 are present between the wiring electrodes 5, which are formed at positions adjacent to the reflectors 4, and the piezoelectric substrate 2 as illustrated in FIG. 20.

Therefore, the duplexer 1 reduces surface acoustic waves, which propagate from the IDTs 3, by the air gaps 9b, and breaking of the wiring electrodes 5 and a short circuit between the wiring electrodes 5 are reliably prevented.

Note that the grooves 9 are preferably provided at positions adjacent to the reflectors 4 only in the transmission filter 20 to which a large amount of power is to be applied. However, in the case where the duplexer 1 is a system such as a femtocell in which a large amount of power is to be applied to the reception filter 30, advantageous effects similar to the above are obtained for the reception filter 30 by providing grooves at positions adjacent to the reflectors 4 in the reception filter 30.

After that, in addition, formation of an external terminal, which is not illustrated, connection of the duplexer 1 and a circuit board, and the like are suitably performed by using appropriate structures and appropriate methods. Note that the manufacturing method illustrated in FIG. 15 to FIG. 21 is a non-limiting example, and a method of manufacturing the duplexer 1 according to the third preferred embodiment of the present invention is not limited to the above-described manufacturing method.

As described above, in the duplexer 1 according to the third preferred embodiment of the present invention, the grooves 9 are arranged around the position at which the IDTs 3 are to be provided in such a manner that the portion of the major surface at the position at which the IDTs 3 are to be provided defines the protruding portion, and the wiring electrodes 5, which are to be disposed in the vicinity of the IDTs 3, are provided in the grooves 9. As a result, the duplexer 1 reduces surface acoustic waves that propagate from the IDTs 3 as a result of reflection or scattering on surfaces of acoustic impedance mismatching that are defined by the air gaps 9b, which are provided by the grooves 9, and breaking of the wiring electrodes 5 and a short circuit between the wiring electrodes 5 are reliably prevented. Note that, in the duplexer 1 according to the third preferred embodiment of the present invention, the height of a portion of each of the wiring electrodes 5, which are provided in the corresponding grooves 9, is significantly reduced so as to be low.

In addition, in the duplexer 1 according to the third preferred embodiment of the present invention, the grooves 9 are located adjacent to the busbar portions 3b of the IDTs 3, and thus, surface acoustic waves that propagate to the busbar portions 3b are also be reduced. In particular, the duplexer 1 according to the third preferred embodiment of the present invention provides a larger advantageous effect in the case where a Rayleigh wave or a Love wave, a large amount of which leaks out to the busbar portions 3b, is used as a main response wave.

Note that the duplexer 1 is not limited to the case where only the step, which is defined by the grooves 9, is provided as a different acoustic portion, and both the portions in which the steps, which are defined by the grooves 8 and/or the grooves 9, are provided, and the portions in which the acoustic members 6 described in the first preferred embodiment are provided are defined as the different acoustic portions. In addition, the duplexer 1 further reduces the surface acoustic waves, which propagate from the IDTs 3, by providing the acoustic members 6 in the portions in which the grooves 9 are located and by providing wiring electrodes on the acoustic members 6.

The preferred embodiments disclosed herein are examples in all respects, and the present invention is not to be considered limited to the preferred embodiments. The scope of the present invention is to be determined not by the above description, but by the claims, and it is intended that meanings equal to the claims and all the modifications within the scope of the claims are included in the scope of the present invention.

What is claimed is:

1. A filter device comprising:
    a piezoelectric substrate;
    an interdigital transducer (IDT) arranged on a major surface of the piezoelectric substrate to define a surface acoustic wave resonator;
    a reflector provided on the piezoelectric substrate;
    a wiring electrode electrically connected to the IDT; and
    a different acoustic portion that is located near or adjacent to the IDT and that has an acoustic impedance different from an acoustic impedance of the piezoelectric substrate;
    wherein
    the wiring electrode is located in the different acoustic portion;
    the different acoustic portion includes a portion in which an acoustic member that has an acoustic impedance different from the acoustic impedance of the piezoelectric substrate is located;
    the acoustic member is located at a position adjacent to the reflector, and the wiring electrode is provided on the acoustic member such that surface acoustic waves that propagate by passing through the reflector do not directly propagate to the wiring electrode and propagate to the wiring electrode after being reduced by the acoustic member; and
    the different acoustic portion includes a portion in which a step that is provided in the major surface of the piezoelectric substrate and a surface that is not in a same plane as the major surface is provided.

2. The filter device according to claim 1, wherein an acoustic impedance Za to a surface acoustic wave on the major surface of the piezoelectric substrate and an acoustic impedance Zc of the acoustic member to an acoustic velocity of a transversal wave have a relationship of Zc/Za<about 0.17.

3. The filter device according to claim 1, wherein the different acoustic portion includes the step that is defined by a groove that is provided in the major surface of the piezoelectric substrate.

4. The filter device according to claim 1, wherein the different acoustic portion includes the step that is arranged such that the major surface of the piezoelectric substrate on which the IDT is to be located is a protruding portion.

5. The filter device according to claim 1, wherein the different acoustic portion is located at a position adjacent to the reflector that is located near the IDT.

6. The filter device according to claim 1, wherein the filter device is one of a duplexer, a surface acoustic wave filter device, a transmission filter, a diplexer, a triplexer, and a multiplexer.

7. The filter device according to claim 1, further comprising a plurality of the IDTs and additional reflectors arranged on opposite ends of the plurality of IDTs.

8. The filter device according to claim 7, wherein the different acoustic portion includes a plurality of the acoustic members each of which has an acoustic impedance different from the acoustic impedance of the piezoelectric substrate.

9. The filter device according to claim 8, wherein the plurality of acoustic members are films located adjacent to at least some of the additional reflectors.

10. The filter device according to claim 1, wherein an acoustic impedance Za to a surface acoustic wave on the major surface of the piezoelectric substrate and an acoustic impedance Zc of the acoustic member to an acoustic velocity of a transversal wave have a relationship of Zc/Za>about 5.8.

11. The filter device according to claim 1, wherein the different acoustic portion includes a plurality of air gaps.

12. The filter device according to claim 11, wherein the air gaps are defined by steps provided in the major surface of the piezoelectric substrate.

13. The filter device according to claim 12, wherein the steps are defined by grooves provided in the major surface of the piezoelectric substrate.

14. The filter device according to claim 1, wherein the different acoustic portion includes a plurality of acoustic members and a plurality of air gaps.

15. The filter device according to claim 14, wherein the acoustic members are films and the air gaps are defined by steps provided in the major surface of the piezoelectric substrate.

16. The filter device according to claim 1, wherein the different acoustic portion includes a plurality of air gaps defined by steps provided in the major surface of the piezoelectric substrate so as to provide protruding portions.

* * * * *